(12) United States Patent
Miyata et al.

(10) Patent No.: US 10,431,516 B2
(45) Date of Patent: *Oct. 1, 2019

(54) SEMICONDUCTOR DEVICE AND METHOD FOR MANUFACTURING SEMICONDUCTOR DEVICE

(71) Applicant: ROHM CO., LTD., Kyoto (JP)

(72) Inventors: Osamu Miyata, Kyoto (JP); Masaki Kasai, Kyoto (JP); Shingo Higuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 31 days.

This patent is subject to a terminal disclaimer.

(21) Appl. No.: 15/438,268

(22) Filed: Feb. 21, 2017

(65) Prior Publication Data

US 2017/0162463 A1 Jun. 8, 2017

Related U.S. Application Data

(63) Continuation of application No. 15/059,278, filed on Mar. 2, 2016, now Pat. No. 9,601,441, which is a (Continued)

(30) Foreign Application Priority Data

| Nov. 16, 2004 | (JP) | 2004-332175 |
| Jan. 14, 2005 | (JP) | 2005-007983 |
| Jun. 28, 2005 | (JP) | 2005-188732 |
| Aug. 2, 2005 | (JP) | 2005-224421 |

(51) Int. Cl.
*H01L 23/48* (2006.01)
*H01L 23/31* (2006.01)
(Continued)

(52) U.S. Cl.
CPC .......... *H01L 23/3178* (2013.01); *H01L 21/78* (2013.01); *H01L 23/291* (2013.01); *H01L 23/293* (2013.01); *H01L 23/3114* (2013.01); *H01L 23/3142* (2013.01); *H01L 23/3171* (2013.01); *H01L 23/3192* (2013.01); *H01L 23/528* (2013.01); *H01L 23/544* (2013.01); *H01L 23/562* (2013.01); *H01L 24/02* (2013.01);
(Continued)

(58) Field of Classification Search
CPC ............... H01L 23/3142; H01L 23/562; H01L 23/3171; H01L 23/293
See application file for complete search history.

(56) References Cited

U.S. PATENT DOCUMENTS

| 6,424,051 B1 | 7/2002 | Shinogi et al. |
| 6,482,730 B1 | 11/2002 | Masumoto et al. |

(Continued)

FOREIGN PATENT DOCUMENTS

| CN | 1441479 A | 9/2003 |
| CN | 1667801 A | 9/2005 |

(Continued)

*Primary Examiner* — Hoa B Trinh

(57) ABSTRACT

A semiconductor device includes a semiconductor chip having a passivation film, a stress relieving layer provided on the passivation film, and a groove formed in a periphery of a surface of the semiconductor chip, the groove being provided inside of an edge of the semiconductor chip, wherein the stress relieving layer is partly disposed in the groove.

11 Claims, 15 Drawing Sheets

Related U.S. Application Data continuation of application No. 14/795,955, filed on Jul. 10, 2015, now Pat. No. 9,312,228, which is a continuation of application No. 14/565,498, filed on Dec. 10, 2014, now Pat. No. 9,111,819, which is a continuation of application No. 14/306,327, filed on Jun. 17, 2014, now Pat. No. 8,928,156, which is a continuation of application No. 14/059,489, filed on Oct. 22, 2013, now Pat. No. 8,786,106, which is a continuation of application No. 12/659,968, filed on Mar. 26, 2010, now Pat. No. 8,575,764, which is a continuation of application No. 11/667,849, filed as application No. PCT/JP2005/021048 on Nov. 16, 2005, now Pat. No. 7,714,448.

(51) Int. Cl.
*H01L 23/00* (2006.01)
*H01L 23/29* (2006.01)
*H01L 23/528* (2006.01)
*H01L 23/544* (2006.01)
*H01L 21/78* (2006.01)

(52) U.S. Cl.
CPC ............ *H01L 24/10* (2013.01); *H01L 24/13* (2013.01); *H01L 24/94* (2013.01); *H01L 24/96* (2013.01); *H01L 24/05* (2013.01); *H01L 2223/5446* (2013.01); *H01L 2224/024* (2013.01); *H01L 2224/0226* (2013.01); *H01L 2224/0239* (2013.01); *H01L 2224/02255* (2013.01); *H01L 2224/02377* (2013.01); *H01L 2224/02381* (2013.01); *H01L 2224/05001* (2013.01); *H01L 2224/05008* (2013.01); *H01L 2224/05022* (2013.01); *H01L 2224/05124* (2013.01); *H01L 2224/05568* (2013.01); *H01L 2224/05569* (2013.01); *H01L 2224/05571* (2013.01); *H01L 2224/05647* (2013.01); *H01L 2224/12105* (2013.01); *H01L 2224/131* (2013.01); *H01L 2224/13023* (2013.01); *H01L 2224/13024* (2013.01); *H01L 2224/13099* (2013.01); *H01L 2224/13124* (2013.01); *H01L 2224/16* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01074* (2013.01); *H01L 2924/05042* (2013.01); *H01L 2924/05442* (2013.01); *H01L 2924/0665* (2013.01); *H01L 2924/07025* (2013.01); *H01L 2924/10161* (2013.01); *H01L 2924/10253* (2013.01); *H01L 2924/12042* (2013.01); *H01L 2924/182* (2013.01); *H01L 2924/186* (2013.01); *H01L 2924/3025* (2013.01)

(56) References Cited

U.S. PATENT DOCUMENTS

| | | | |
|---|---|---|---|
| 6,621,154 | B1 | 9/2003 | Satoh et al. |
| 6,940,160 | B1 | 9/2005 | Hanaoka et al. |
| 7,023,088 | B2 | 4/2006 | Suzuki et al. |
| 7,122,910 | B2 | 10/2006 | Nagasaki |
| 7,183,189 | B2 | 2/2007 | Hashimoto |
| 7,714,448 | B2 * | 5/2010 | Miyata ................ H01L 23/3114 257/778 |
| 8,575,764 | B2 * | 11/2013 | Miyata ................ H01L 23/3114 257/778 |
| 8,786,106 | B2 * | 7/2014 | Miyata ................ H01L 23/3114 257/778 |
| 8,928,156 | B2 * | 1/2015 | Miyata ................ H01L 23/3114 257/778 |
| 9,111,819 | B2 * | 8/2015 | Miyata ................ H01L 23/3114 |
| 9,312,228 | B2 * | 4/2016 | Miyata ................ H01L 23/3114 |
| 9,601,441 | B2 * | 3/2017 | Miyata ................ H01L 23/3114 |
| 2001/0003049 | A1 | 6/2001 | Fukasawa et al. |
| 2003/0162369 | A1 | 8/2003 | Kobayashi |
| 2004/0169287 | A1 | 9/2004 | Honda |
| 2004/0238926 | A1 | 12/2004 | Obinata |
| 2005/0194684 | A1 | 9/2005 | Nagasaki |
| 2006/0292742 | A1 | 12/2006 | Nagasaki |
| 2007/0126109 | A1 | 6/2007 | Hashimoto |
| 2010/0187659 | A1 | 7/2010 | Miyata et al. |

FOREIGN PATENT DOCUMENTS

| | | |
|---|---|---|
| JP | 05-041377 A | 2/1993 |
| JP | 2000-195862 A | 7/2000 |
| JP | 2000-232104 A | 8/2000 |
| JP | 2000-243729 A | 9/2000 |
| JP | 2001-298120 | 10/2001 |
| JP | 2003-124392 A | 4/2003 |
| JP | 2003-179184 | 6/2003 |
| JP | 2003-297866 A | 10/2003 |
| JP | 2004-134640 A | 4/2004 |
| JP | 2004-281898 | 10/2004 |
| JP | 2004-288816 | 10/2004 |
| JP | 2004-296761 | 10/2004 |
| JP | 2006-173548 A | 6/2006 |
| JP | 2007-012712 A | 1/2007 |

* cited by examiner

SEMICONDUCTOR DEVICE AND METHOD FOR MANUFACTURING SEMICONDUCTOR DEVICE

CROSS-REFERENCE TO RELATED APPLICATIONS

This application is a continuation of copending application Ser. No. 15/059,278, filed on Mar. 2, 2016, which is a continuation of application Ser. No. 14/795,955, filed on Jul. 10, 2015, issued as U.S. Pat. No. 9,312,228 on Apr. 12, 2016, which is a continuation of application Ser. No. 14/565,498, filed on Dec. 10, 2014, issued as U.S. Pat. No. 9,111,819 on Aug. 18, 2015, which is a continuation of application Ser. No. 14/306,327, filed on Jun. 17, 2014, issued as U.S. Pat. No. 8,928,156 on Jan. 6, 2015, which is a continuation of application Ser. No. 14/059,489, filed on Oct. 22, 2013, issued as U.S. Pat. No. 8,786,106 on Jul. 22, 2014, which is a continuation of application Ser. No. 12/659,968, filed on Mar. 26, 2010, issued as U.S. Pat. No. 8,575,764 on Nov. 5, 2013, which is a continuation of application Ser. No. 11/667,849, filed on Aug. 22, 2007, and issued as U.S. Pat. No. 7,714,448 on May 11, 2010, which is a National Stage application of PCT/JP2005/021048, filed on Nov. 16, 2005. Furthermore, the prior U.S. applications claimed, and the present application claims the benefit of priority of Japanese applications No. 2004-332175, filed on Nov. 16, 2004, 2005-007983, filed on Jan. 14, 2005, 2005-188732, filed on Jun. 28, 2005, and 2005-224421, filed on Aug. 2, 2005. The disclosures of these prior U.S. and Japanese applications are incorporated herein by reference.

TECHNICAL FIELD

The present invention relates to a semiconductor device and a production method therefore and, particularly, to a semiconductor device and a production method therefore, which employ a WL-CSP (wafer level-chip scale package) technique.

RELATED ART

For higher performance and multifunctional semiconductor devices, the WL-CSP technique has recently been put into practical use. In the WL-CSP technique, the packaging of chips is completed on a wafer level, so that packages obtained by dicing the wafer each have a size equivalent to a chip size (for example, see Patent document 1).

As shown in FIG. 19, a semiconductor device employing the WL-CSP technique includes a semiconductor chip 101 having a front surface entirely covered with a passivation film 102. The passivation film 102 has pad openings 104 through which parts of an internal interconnection provided in the front surface of the semiconductor chip 101 are exposed as electrode pads 103. A polyimide layer 105 is provided on the passivation film 102. Rewirings 106 are provided on the polyimide layer 105. The rewirings 106 are connected to the respective electrode pads 103 through through-holes 107 formed in the polyimide layer 105 as extending through the polyimide layer 105. A sealing resin layer 108 of an epoxy resin is provided on the polyimide layer 105 and the rewirings 106. The rewirings 106 are respectively connected to solder balls 110 provided on a surface of the sealing resin layer 108 via posts 109 extending through the sealing resin layer 108.

The semiconductor device is produced in the following manner. First, a wafer formed with a plurality of semiconductor chips is prepared. A front surface of the wafer is entirely covered with a passivation film 102. After a polyimide film 105 and rewirings 106 are formed on the passivation film 102, a sealing resin layer 108 is formed on the polyimide layer 105 and the rewirings 106, followed by formation of posts 109 and solder balls 110. Thereafter, the resulting wafer is diced together with the passivation film 102 and the sealing resin layer 108 along dicing lines defined between the semiconductor chips formed in the wafer. Thus, the semiconductor device shown in FIG. 19 is provided.

Patent Document 1: Japanese Unexamined Patent Publication No. 2001-298120

SUMMARY OF THE INVENTION

Problems to be Solved

In the semiconductor device thus produced, however, side surfaces of the semiconductor chip 101, the passivation film 102 and the sealing resin layer 108 are exposed in flush relation. Therefore, if a great stress is applied to a side surface of the semiconductor device, the passivation film 102 which has a smaller thickness is liable to be separated or cracked on the side surface. If the separation and cracking of the passivation film 102 reach a device formation region of the semiconductor chip 101, a functional device formed in the device formation region is liable to malfunction.

It is therefore an object of the present invention to provide a semiconductor device and a production method therefore which prevent the separation and cracking of the passivation film.

Solution to the Problems

According to one aspect of the present invention, a semiconductor device comprises a semiconductor chip having a passivation film, and a sealing resin layer provided over the passivation film for sealing a front side of the semiconductor chip, wherein the sealing resin layer extends to a side surface of the passivation film to cover the side surface. With this arrangement, the sealing resin layer extends to the side surface of the passivation film, so that the side surface of the passivation film is covered with the sealing resin layer. This prevents the separation and cracking of the passivation film.

The semiconductor chip may have a groove provided in a peripheral edge portion of a front surface thereof, and the sealing resin layer may be partly disposed in the groove. With this arrangement, a portion of the sealing resin layer disposed in the groove also absorbs a stress applied to a side surface of the semiconductor device. Therefore, the separation and cracking of the passivation film is more assuredly prevented.

The passivation film may be divided into a center portion and a peripheral portion disposed on opposite sides of the groove, the center portion completely covering a device formation region of the semiconductor chip, the peripheral portion being spaced a predetermined distance from a periphery of the center portion as surrounding the center portion. In other words, the groove may be looped so as to surround a device formation region when the front surface of the semiconductor chip is seen in plan from above, and the passivation film may include a center portion and a peripheral portion respectively disposed inward and outward of the groove. With this arrangement, even if the separation or cracking of the passivation film occurs on the side surface of the semiconductor device, the separation and cracking of the passivation film can be confined in the peripheral portion of the passivation film. As a result, separation and cracking of the center portion of the passivation film is prevented, so that malfunction of a functional device of the semiconductor chip can be prevented which may otherwise occur due to the separation and cracking.

The semiconductor device according to the aforesaid aspect may further comprise a stress relieving layer provided between the passivation film and the sealing resin layer for absorbing and relieving an externally applied stress. In this case, the stress relieving layer may be partly disposed in the groove, or may be provided outside the groove with its side surface being substantially flush with the side surface of the passivation film. Where the stress relieving layer is partly disposed in the groove, a portion of the stress relieving layer disposed in the groove absorbs the stress applied to the side surface of the semiconductor device. Therefore, the separation and cracking of the passivation film is more assuredly prevented. On the other hand, a structure such that the side surface of the stress relieving layer is substantially flush with the side surface of the passivation film can be easily provided, for example, by etching away a portion of the passivation film exposed from the stress relieving layer by utilizing the stress relieving layer as a mask.

The sealing resin layer may extend to the side surface of the stress relieving layer. With the sealing resin layer extending to the side surface of the stress relieving layer, the side surface of the stress relieving layer is covered with the sealing resin layer. Therefore, the stress relieving layer is shielded from the outside air, so that degradation of the stress relieving layer can be prevented which may otherwise occur due to moisture contained in the outside air.

The groove may be provided along an outermost peripheral edge of the front surface of the semiconductor chip. In this case, the groove preferably has a width which is greater than 5 μm as measured within a plane containing the front surface of the semiconductor chip, and a depth which is greater than 3 μm and smaller than 50 μm as measured perpendicularly to the plane. Where the width of the groove is greater than 5 μm, the portion of the sealing resin layer disposed in the groove sufficiently adheres to a substrate serving as a base of the semiconductor chip, so that separation of the sealing resin layer from the substrate can be prevented. Where the depth of the groove is in the range between 3 μm and 50 μm, it is possible to protect the passivation film while allowing the semiconductor chip to have a sufficient strength. In a production process, a rear surface of the semiconductor chip (substrate) is ground by a grinder for thickness reduction of the semiconductor device. However, if the groove is too deep, a portion of the semiconductor chip between the rear surface and the groove is liable to be cracked due to a pressure acting on the rear surface when the grinder is pressed against the rear surface of the semiconductor chip. Where the depth of the groove is smaller than 50 μm, the semiconductor chip has strength sufficient to prevent the cracking.

The groove may have a triangular sectional shape which is tapered toward the rear surface of the semiconductor chip.

The semiconductor device according to the aforesaid aspect may further comprise an interlayer film provided between the passivation film and the semiconductor substrate serving as the base of the semiconductor chip, wherein the sealing resin layer extends to side surfaces of the passivation film and the interlayer film to cover the side surfaces of the passivation film and the interlayer film. With this arrangement, the side surfaces of the passivation film and the interlayer film are covered with the sealing resin layer, so that the separation and cracking of the interlayer film as well as the passivation film can be prevented.

According to a second aspect of the present invention, a semiconductor device comprises a semiconductor chip having a passivation film, and a stress relieving layer provided over the passivation film for absorbing and relieving an externally applied stress, wherein the stress relieving layer extends to a side surface of the passivation film to cover the side surface.

With this arrangement, the stress relieving layer extends to the side surface of the passivation film, so that the side surface of the passivation film is covered with the stress relieving layer. This prevents the separation and cracking of the passivation film.

The semiconductor chip may have a groove provided in a peripheral edge portion of a front surface thereof, and the stress relieving layer may be partly disposed in the groove. With this arrangement, a portion of the stress relieving layer disposed in the groove also absorbs a stress applied to a side surface of the semiconductor device. Therefore, the separation and cracking of the passivation film is more assuredly prevented.

The semiconductor device according to the second aspect may further comprise an interlayer film provided between the passivation film and a semiconductor substrate serving as a base of the semiconductor chip, wherein the stress relieving layer extends to side surfaces of the passivation film and the interlayer film to cover the side surfaces of the passivation film and the interlayer film. With this arrangement, the side surfaces of the passivation film and the interlayer film are covered with the stress relieving layer, so that the separation and cracking of the interlayer film as well as the passivation film can be prevented.

The semiconductor device according to the second aspect may further comprise a sealing resin layer provided on the stress relieving layer for sealing a front side of the semiconductor chip, wherein the sealing resin layer has a side surface which is substantially flush with a side surface of the stress relieving layer.

A semiconductor device production method according to the present invention comprises the steps of: preparing a semiconductor wafer formed with a plurality of semiconductor chips and having a front surface covered with a passivation film; removing at least a portion of the passivation film present in a zone extending along each dicing line defined on the semiconductor wafer; forming a sealing resin layer on the resulting semiconductor wafer after the passivation film removing step; and dicing the resulting semiconductor wafer along the dicing line to separate the semiconductor chips from each other after the sealing resin layer forming step. By this method, a semiconductor device is provided, which has a size equivalent to the size of the chip and has a construction such that the sealing resin layer extends at least to a side surface of the passivation film.

The passivation film removing step may be the step of removing at least a portion of the passivation film present in a zone defined on the dicing line and having a predetermined width. In this case, a semiconductor device is provided, which has a construction such that at least the passivation film is not present on an outermost peripheral edge of the front surface of the semiconductor chip and the sealing resin layer is partly disposed on the peripheral edge free from the passivation film.

In this case, the passivation film removing step may be the step of forming a recess extending from a front surface of the passivation film to below the passivation film. In this case, a semiconductor device is provided, which is constructed such that the recess (groove) is provided on the outermost peripheral edge of the front surface of the semiconductor chip and the sealing resin layer is partly disposed in the recess.

The passivation film removing step may be the step of removing at least a portion of the passivation film present in a zone extending alongside the dicing line and spaced a predetermined distance from the dicing line. In this case, a semiconductor device is provided, which is constructed such that the passivation film is divided into a center portion which completely covers a device formation region of the semiconductor chip and a peripheral portion which is spaced a predetermined distance from a periphery of the center portion as surrounding the center portion.

In this case, the passivation film removing step may be the step of forming a recess extending from a surface of the passivation film to below the passivation film. In this case, a semiconductor device is provided, which is constructed such that the recess (groove) is provided between the center portion and the peripheral portion of the passivation film and the sealing resin layer is partly disposed in the recess.

The semiconductor device production method may further comprise the step of forming a stress relieving layer over the resulting semiconductor wafer after the passivation film removing step before the sealing resin layer forming step. In this case, a semiconductor device is provided, which is constructed such that the stress relieving layer extends to the side surface of the passivation film.

The foregoing and other objects, features and effects of the present invention will become more apparent from the following description of the embodiments with reference to the attached drawings.

BEST MODE FOR CARRYING OUT THE INVENTION

Embodiments of the present invention will hereinafter be described in detail with reference to the attached drawings.

Figure 1:
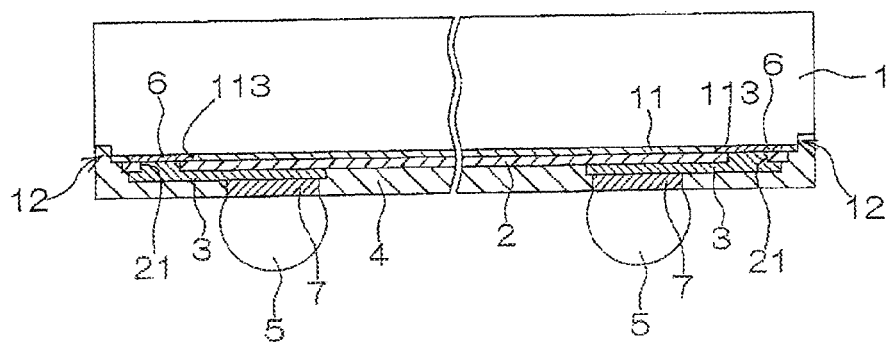
FIG. 1 is a sectional view illustrating the construction of a semiconductor device according to a first embodiment of the present invention.

FIG. 1 is a sectional view illustrating the construction of a semiconductor device according to a first embodiment of the present invention. The semiconductor device is a semiconductor device employing the WL-CSP technique, and includes a semiconductor chip 1, a passivation film (surface protection film) 11 covering a front surface of the semiconductor chip 1 (on a side formed with a functional device), a stress relieving layer 2 provided on the passivation film 11, rewirings 3 provided on the stress relieving layer 2, a sealing resin layer 4 provided over the rewirings 3, and metal balls 5 provided on the sealing resin layer 4.

The semiconductor chip 1 is of a rectangular shape as seen in plan, and has a groove 12 formed in a peripheral edge portion of the outermost front surface thereof. The formation of the groove 12 is achieved by cutting away a peripheral edge portion of the outermost front surface of the semiconductor chip 1 having, for example, a square sectional shape having a width of 10 to 20 µm and a depth of 10 to 100 µm.

The passivation film 11 is composed of silicon oxide or silicon nitride, and covers the entire front surface of the semiconductor chip 1 except the groove 12. The passivation film 11 has pad openings 113 through which parts of an internal interconnection of a metal such as aluminum provided in the front surface of the semiconductor chip 1 are exposed as electrode pads 6.

The stress relieving layer 2 is composed of, for example, polyimide, and is adapted to absorb and relieve a stress applied to the semiconductor device. The stress relieving layer 2 has a rectangular shape which is slightly smaller than the passivation film 11 as seen in plan. Further, the stress relieving layer 2 has through-holes 21 provided at positions opposed to the respective electrode pads 6 as extending therethrough.

The rewirings 3 are composed of a metal material such as copper, and provided on a surface of the stress relieving layer 2 as extending to positions opposed to the respective metal balls 5 with the intervention of the sealing resin layer 4.

The sealing resin layer 4 is composed of, for example, an epoxy resin, and seals the front side of the semiconductor chip 1. The sealing resin layer 4 completely covers front surfaces of the passivation film 11, the stress relieving layer 2 and the rewirings 3, and extends from the front surfaces to side surfaces of these layers to completely fill the groove 12 of the semiconductor chip 1. The sealing resin layer 4 has a flat front surface, and side surfaces flush with side surfaces of the semiconductor chip 1. Thus, the semiconductor device has a generally rectangular solid shape which has a size equivalent to the size of the semiconductor chip 1 as seen in plan.

Flat cylindrical posts 7 of a metal such as copper are respectively provided between the rewirings 3 and the metal balls 5 as extending through the sealing resin layer 4. The rewirings 3 are respectively connected to the metal balls 5 via the posts 7.

The metal balls 5 serve as external connection terminals for connection (external connection) to a wiring board not shown, and are formed of a metal material such as solder as having a ball-like shape.

With the aforesaid arrangement, the side surfaces of the passivation film 11 are covered with the sealing resin layer 4, and are not exposed to the side surfaces of the semiconductor device. Therefore, separation and cracking of the passivation film 11 is prevented, which may otherwise occur due to a stress applied to a side surface of the semiconductor device.

Further, the groove 12 is provided in the peripheral edge portion of the outermost front surface of the semiconductor chip 1, and the sealing resin layer 4 is partly disposed in the groove 12. Therefore, a portion of the sealing resin layer 4 disposed in the groove 12 also absorbs the stress applied to the side surface of the semiconductor device, so that the separation and cracking of the passivation film 11 can be more assuredly prevented.

Figure 2A:
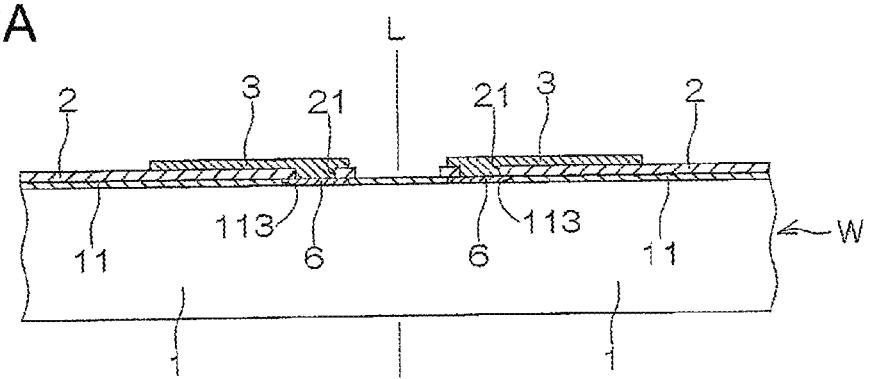
FIGS. 2A-2D are sectional views illustrating the sequential steps of a production process for the semiconductor device shown in FIG. 1.

FIGS. 2A-2D are sectional views illustrating the sequential steps of a production process for the semiconductor device shown in FIG. 1. First, a wafer W formed with a plurality of semiconductor chips 1 and having a front surface entirely covered with a passivation film 11 is prepared. As shown in FIG. 2A, pad openings 113 are formed in the passivation film 11 for exposing electrode pads 6, and then stress relieving layers 2 and rewirings 3 are formed in this order on the passivation film 11.

The stress relieving layers 2 are not present on dicing lines L defined between the semiconductor chips 1. Therefore, the stress relieving layers 2 disposed on adjacent ones of the semiconductor chips 1 on opposite sides of each of the dicing lines L are spaced a predetermined distance from each other, so that the passivation film 11 is partly exposed along the dicing line L between the stress relieving layers 2.

Figure 2B:
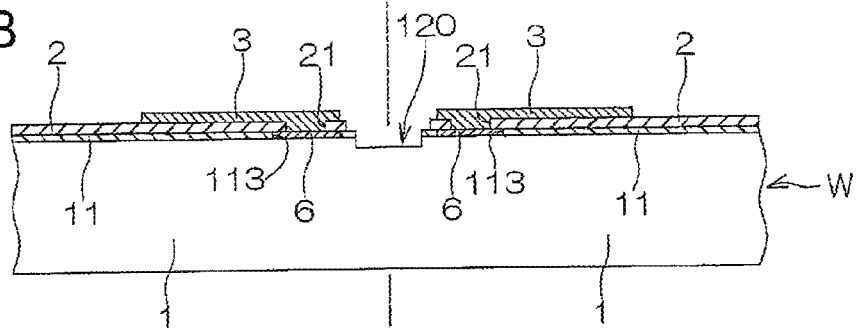

In turn, as shown in FIG. 2B, a recess 120 is formed along the dicing line L as extending from the front surface of the passivation film 11 to below the passivation film 11. The formation of the recess 120 is achieved, for example, by a half-cutting process for half-cutting the resulting wafer from the front side of the passivation film 11 with the use of a blade (not shown) which has a greater thickness (width) than a dicing blade to be used for dicing the wafer W to separate the semiconductor chips 1 from each other, or by a laser machining process. Where the blade is used, the width and the depth of the recess 120 (groove 12) are controlled by the thickness of the blade and a cut amount.

Figure 2C:
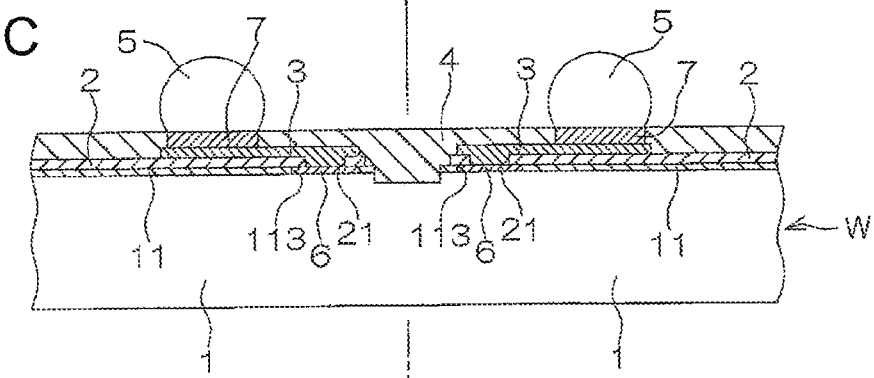

Thereafter, as shown in FIG. 2C, a sealing resin layer 4 is formed over the entire front surface of the resulting wafer W. The formation of the sealing resin layer 4 is achieved by applying an uncured epoxy resin over the entire front surface of the wafer W and curing the applied epoxy resin. After posts 7 are formed at predetermined positions in the sealing resin layer 4, metal balls 5 are formed on the respective posts 7. The formation of the posts 7 is achieved by forming through-holes in the sealing resin layer 4 and supplying a metal material into the through-holes to fill the through-holes by electroplating.

Figure 2D:
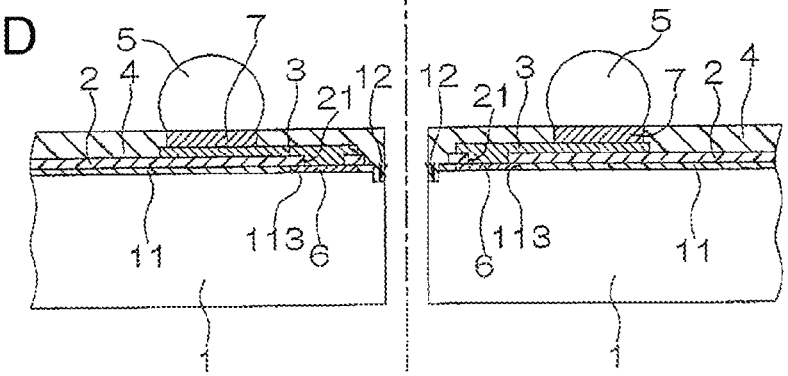

Then, as shown in FIG. 2D, the resulting wafer W is cut (diced) together with the sealing resin layer 4 along the dicing lines L with the use of the dicing blade not shown. Thus, the semiconductor device shown in FIG. 1 is provided.

Figure 3:
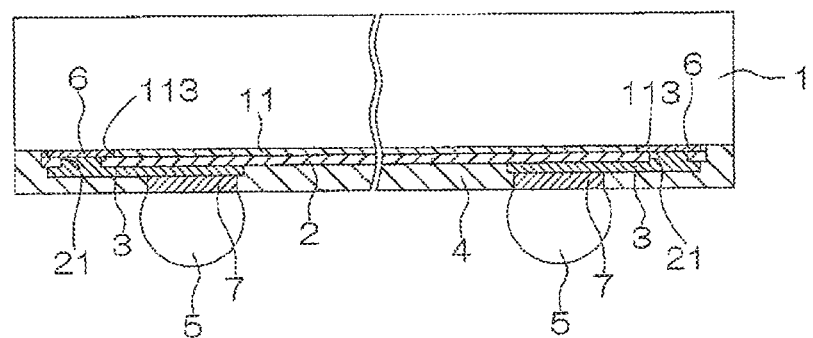
FIG. 3 is a sectional view illustrating the construction of a semiconductor device according to a second embodiment of the present invention.

FIG. 3 is a sectional view illustrating the construction of a semiconductor device according to a second embodiment of the present invention. In FIG. 3, components corresponding to those shown in FIG. 1 will be denoted by the same reference characters as in FIG. 1.

In the semiconductor device shown in FIG. 3, the semiconductor chip 1 is formed with no groove 12, and the side surfaces of the passivation film 11 are flush with the side surfaces of the stress relieving layer 2.

Figure 4A:
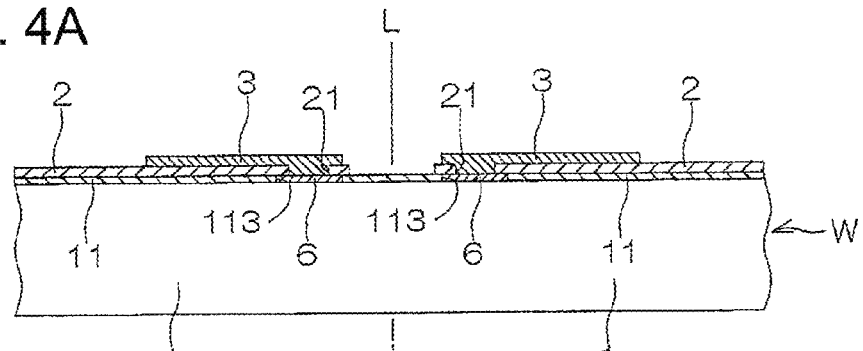
FIGS. 4A-4D are sectional views illustrating the sequential steps of a production process for the semiconductor device shown in FIG. 3.
Figure 4B:
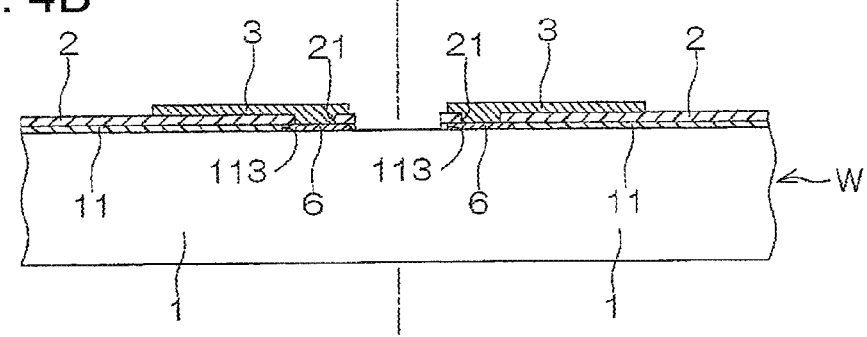

In a production process for the semiconductor device having such a construction, as shown in FIG. 4A, for example, a wafer W covered with a passivation film 11 is prepared, and stress relieving layers 2 and rewirings 3 are formed in this order on the passivation film 11. Thereafter, as shown in FIG. 4B, a portion of the passivation film 11 exposed between the stress relieving layers 2 is etched away by using the stress relieving layers 2 as a mask. That is, a portion of the passivation film 11 present in a zone defined along each of dicing lines L and having a predetermined width is exposed between the stress relieving layers 2 disposed on adjacent ones of the semiconductor chips 1 on opposite sides of the dicing line L. The portion of the passivation film 11 on the dicing line L is removed by etching with the use of the stress relieving layers 2 as the mask.

The etching of the passivation film 11 with the use of the stress relieving layers 2 as the mask is achieved by using an etching liquid which is capable of dissolving the passivation film 11 but incapable of dissolving the stress relieving layers 2. Where the passivation film 11 is composed of silicon oxide, for example, the etching of the passivation film 11 with the use of the stress relieving layers 2 as the mask may be achieved by using nitric acid as the etching liquid. The etching is not limited to the wet etching, but dry etching such as RIE (reactive ion etching) may be employed for the removal of the portion of the passivation film 11 exposed between the stress relieving layers 2.

Figure 4C:
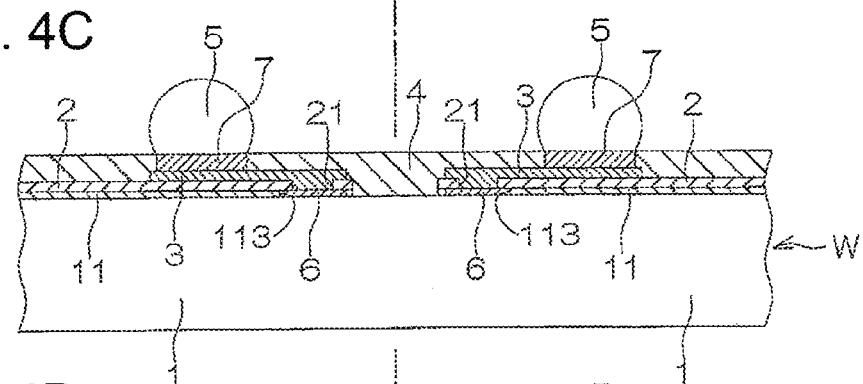
Figure 4D:
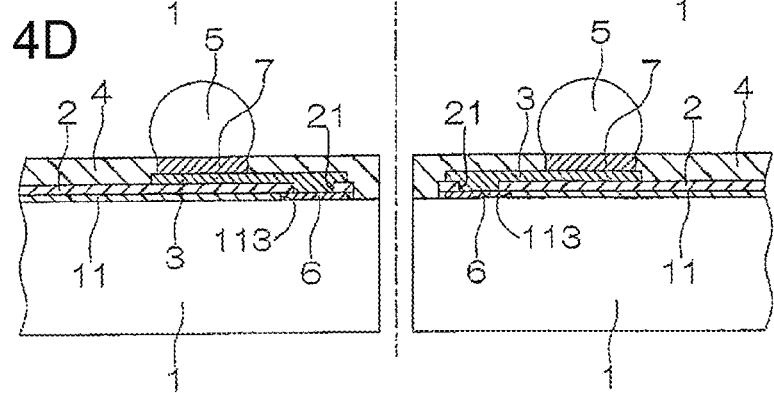

After the etching of the passivation film 11, as shown in FIG. 4C, a sealing resin layer 4 is formed over the entire front surface of the resulting wafer W, and posts 7 and metal balls 5 are formed. Then, as shown in FIG. 4D, the resulting wafer W is cut (diced) together with the sealing resin layer 4 along the dicing lines L with the use of a dicing blade not shown, whereby the semiconductor device shown in FIG. 3 is provided.

Figure 5:
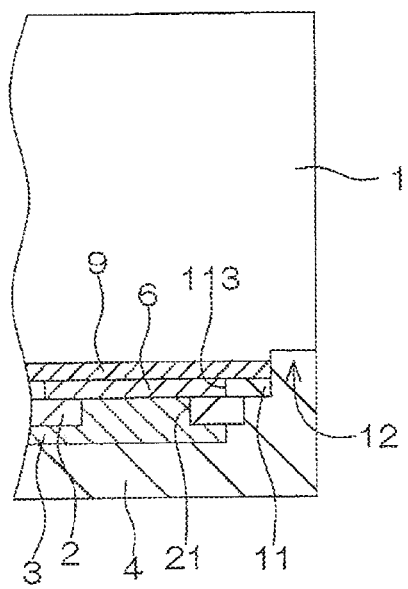
FIG. 5 is a sectional view for explaining the construction of a semiconductor device according to a third embodiment of the present invention.

FIG. 5 is a sectional view for explaining the construction of a semiconductor device according to a third embodiment of the present invention. In FIG. 5, components corresponding to those shown in FIG. 1 will be denoted by the same reference characters as in FIG. 1.

In the semiconductor device shown in FIG. 5, the semiconductor chip 1 includes an interlayer film 9 such as of silicon oxide or silicon nitride provided between the electrode pads 6 (internal interconnection) formed in the front surface of the semiconductor chip 1 and a semiconductor substrate serving as a base of the semiconductor chip 1. The groove 12 extends to below the interlayer film 9 (into the semiconductor substrate), and the sealing resin layer 4 is partly disposed in the groove 12, whereby the side surfaces of the passivation film 11 and the interlayer film 9 are covered with the sealing resin layer 4.

With this arrangement, separation and cracking of the passivation film 11 and the interlayer film 9 can be prevented, which may otherwise occur due to a stress applied to a side surface of the semiconductor device.

Figure 6:
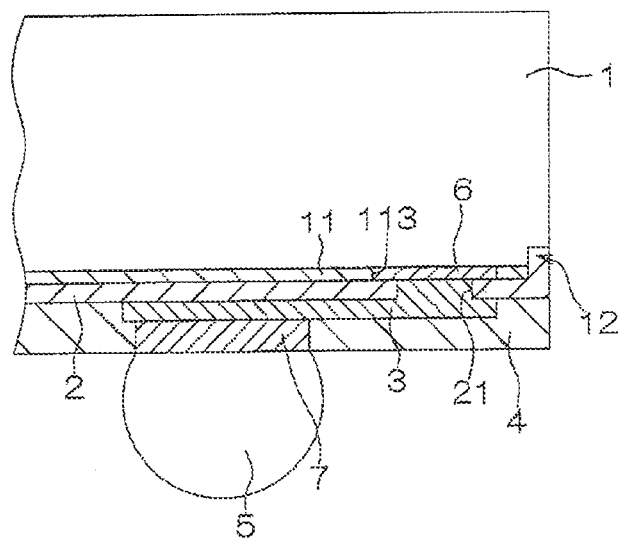
FIG. 6 is a sectional view for explaining the construction of a semiconductor device according to a fourth embodiment of the present invention.

FIG. 6 is a sectional view for explaining the construction of a semiconductor device according to a fourth embodiment of the present invention. In FIG. 6, components corresponding to those shown in FIG. 1 will be denoted by the same reference characters as in FIG. 1.

In the semiconductor device shown in FIG. 6, the stress relieving layer 2 provided on the passivation film 11 extends from the front surface to the side surfaces of the passivation film 11 to completely fill the groove 12 formed in the peripheral edge portion of the front surface of the semiconductor chip 1. The sealing resin layer 4 completely covers the front surface of the stress relieving layer 2.

With this arrangement, the side surfaces of the passivation film 11 are covered with the stress relieving layer 2 and, therefore, are not exposed to side surfaces of the semiconductor device. Hence, separation and cracking of the passivation film 11 can be prevented, which may otherwise occur due to a stress applied to the side surface of the semiconductor device.

In addition, the groove 12 is provided in the peripheral edge portion of the outermost front surface of the semiconductor chip 1, and the stress relieving layer 2 is partly disposed in the groove 12. Therefore, a portion of the stress relieving layer 2 disposed in the groove 12 also absorbs the stress applied to the side surface of the semiconductor device, thereby more assuredly preventing the separation and cracking of the passivation film 11.

Figure 7A:
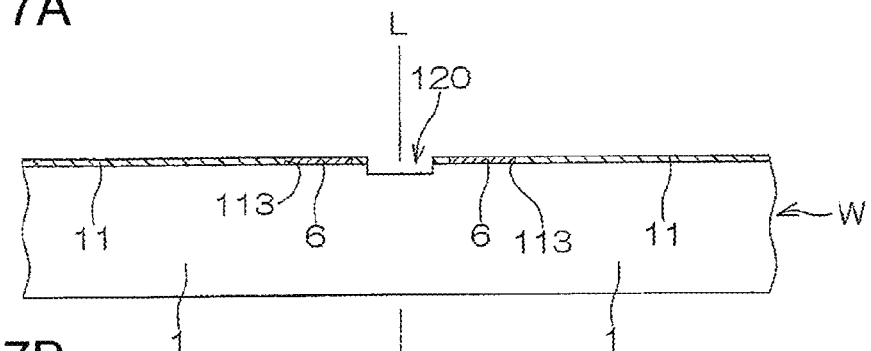
FIGS. 7A-7D are sectional views illustrating the sequential steps of a production process for the semiconductor device shown in FIG. 6.

FIGS. 7A-7D are sectional views illustrating the sequential steps of a production process for the semiconductor device shown in FIG. 6. In the production process for the semiconductor device shown in FIG. 6, a wafer W formed with a plurality of semiconductor chips 1 and having a front surface entirely covered with a passivation film 11 is first prepared. In turn, as shown in FIG. 7A, pad openings 113 are formed in the passivation film 11 for exposing electrode pads 6, and then a recess 120 having a predetermined width is formed along each of dicing lines L as extending from a surface of the passivation film 11 to below the passivation film 11.

Figure 7B:
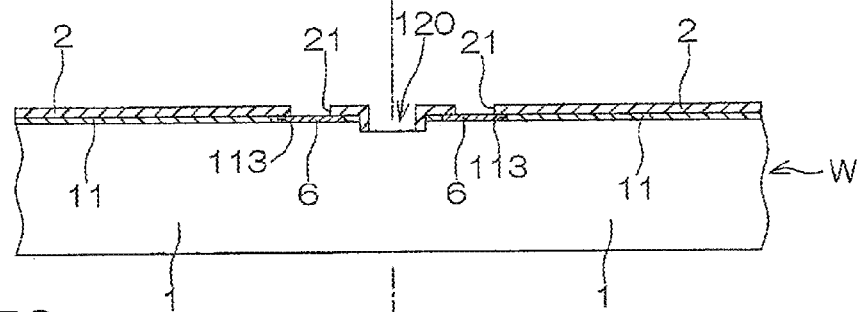

After the formation of the recess 120, as shown in FIG. 7B, stress relieving layers 2 each having through-holes 21 are formed on the passivation film 11. The stress relieving layers 2 are not present in a portion having a smaller width than the recess 120 on the dicing line L defined between the semiconductor chips 1. Therefore, the stress relieving layers 2 disposed on adjacent ones of the semiconductor chips 1 on opposite sides of the dicing line L are spaced from each other, so that the semiconductor chips 1 (wafer W) are partly exposed on the dicing line L between the stress relieving layers 2.

Figure 7C:
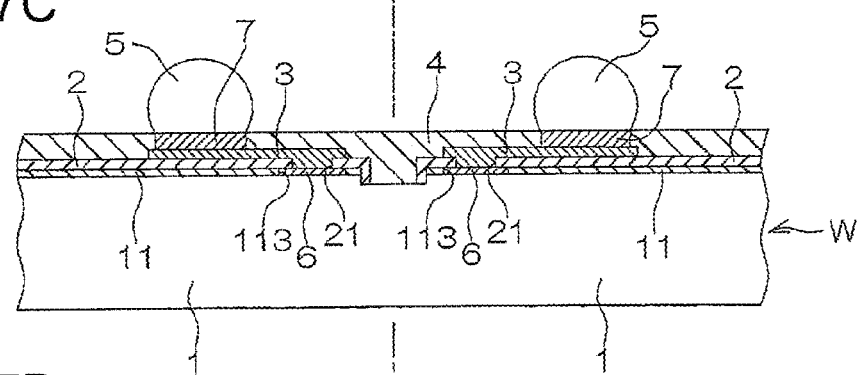

In turn, as shown in FIG. 7C, rewirings 3 and a sealing resin layer 4 are formed, and then posts 7 are formed at predetermined positions in the sealing resin layer 4. Further, metal balls 5 are formed on the respective posts 7.

Figure 7D:
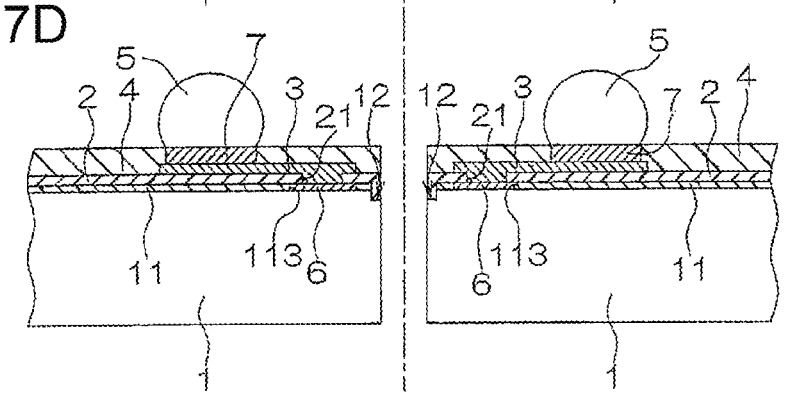

Then, as shown in FIG. 7D, the resulting wafer W is cut (diced) together with the sealing resin layer 4 along the dicing lines L with the use of a dicing blade (not shown) having a thickness (width) substantially equivalent to the width of the portion of the recess 120 free from the stress relieving layers 2. Thus, the semiconductor device shown in FIG. 6 is provided.

Figure 8:
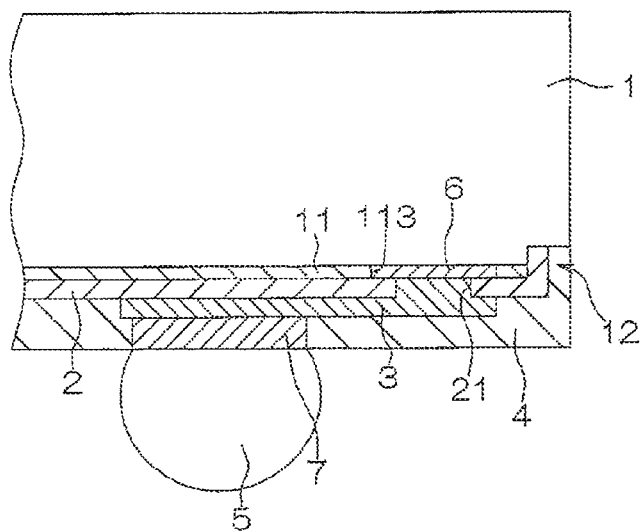
FIG. 8 is a sectional view for explaining the construction of a semiconductor device according to a fifth embodiment of the present invention.

FIG. 8 is a sectional view for explaining the construction of a semiconductor device according to a fifth embodiment of the present invention. In FIG. 8, components corresponding to those shown in FIG. 1 will be denoted by the same reference characters as in FIG. 1.

In the semiconductor device shown in FIG. 8, the stress relieving layer 2 provided on the passivation film 11 extends from the front surface to the side surfaces of the passivation film 11, and is partly disposed in the groove 12 formed in the peripheral edge portion of the outermost front surface of the semiconductor chip 1. Further, the sealing resin layer 4 provided over the stress relieving layer 2 extends from the front surface to the side surfaces of the stress relieving layer 2 to cover the front surface and side surfaces of the passivation film 11 from the outside of the stress relieving layer 2. The groove 12 formed in the peripheral edge portion of the outermost front surface of the semiconductor chip 1 is completely filled with the stress relieving layer 2 and the sealing resin layer 4.

With this arrangement, the side surfaces of the passivation film 11 are covered with the stress relieving layer 2, and the stress relieving layer 2 is covered with the sealing resin layer 4 from the outside thereof. Therefore, the separation and cracking of the passivation film 11 can be more assuredly prevented.

The semiconductor device shown in FIG. 8 is produced by performing sequentially the steps of FIGS. 7A-7C, and then cutting (dicing) the resulting wafer W together with the sealing resin layer 4 along the dicing lines L with the use of a dicing blade (not shown) having a thickness (width) smaller than the width of the portion of the recess 120 free from the stress relieving layers 2 in the step of FIG. 7D.

Figure 9:
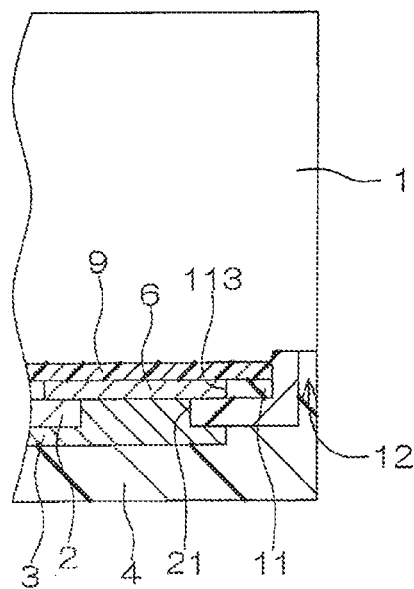
FIG. 9 is a sectional view for explaining the construction of a semiconductor device according to a sixth embodiment of the present invention.

FIG. 9 is a sectional view for explaining the construction of a semiconductor device according to a sixth embodiment of the present invention. In FIG. 9, components corresponding to those shown in FIG. 5 will be denoted by the same reference characters as in FIG. 5.

In the semiconductor device shown in FIG. 9, the semiconductor chip 1 includes an interlayer film 9 such as of silicon oxide or silicon nitride provided between the electrode pads 6 (internal interconnection) formed in the front surface of the semiconductor chip 1 and the semiconductor substrate serving as the base of the semiconductor chip 1. The groove 12 extends to below the interlayer film 9 (into the semiconductor substrate), and the stress relieving layer 2 and the sealing resin layer 4 are partly disposed in the groove 12, whereby the side surfaces of the passivation film 11 and the interlayer film 9 are covered with the stress relieving layer 2 and the sealing resin layer 4.

With this arrangement, separation and cracking of the passivation film 11 and the interlayer film 9 can be prevented, which may otherwise occur due to a stress applied to a side surface of the semiconductor device.

Although the side surfaces of the passivation film 11 and the interlayer film 9 are covered with the stress relieving layer 2 and the sealing resin layer 4 in the construction shown in FIG. 9, only the stress relieving layer 2 may be partly disposed in the groove 12, and the side surfaces of the passivation film 11 and the interlayer film 9 may be covered only with the stress relieving layer 2.

Figure 10:
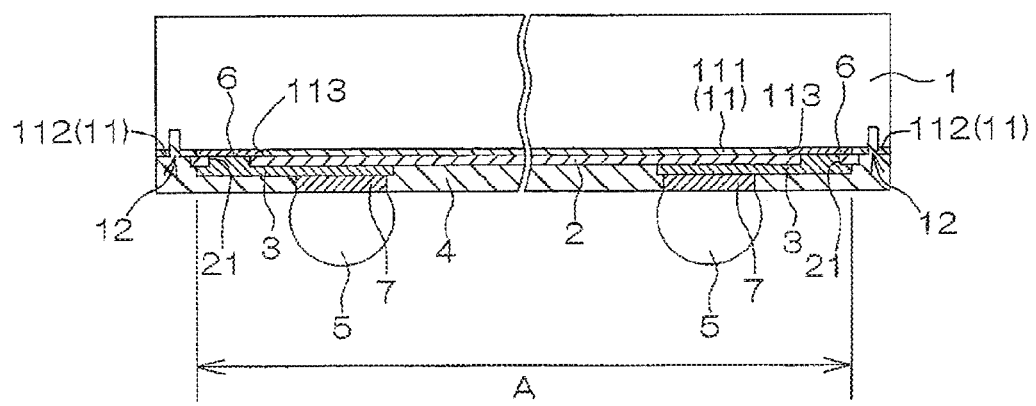
FIG. 10 is a sectional view illustrating the construction of a semiconductor device according to a seventh embodiment of the present invention.

FIG. 10 is a sectional view illustrating the construction of a semiconductor device according to a seventh embodiment of the present invention. In FIG. 10, components corresponding to those shown in FIG. 1 will be denoted by the same reference characters as in FIG. 1.

The semiconductor device is a semiconductor device employing the WL-CSP technique, and includes a semiconductor chip 1 having a passivation film (surface protection film) 11 provided in an outermost front surface thereof, a stress relieving layer 2 provided on the passivation film 11, rewirings 3 provided on the stress relieving layer 2, a sealing resin layer 4 provided over the rewirings 3, and metal balls 5 provided on the sealing resin layer 4.

The semiconductor chip 1 is of a rectangular shape as seen in plan. The semiconductor chip 1 has a looped groove 12 (passivation absent portion) provided in a peripheral edge portion of the front surface thereof as surrounding a device formation region A (a region formed with a functional device in a semiconductor substrate serving as a base of the semiconductor chip 1) as seen in plan from above. The groove 12 is recessed from a front surface of the passivation film 11 and extends to below the passivation film 11 into the semiconductor substrate serving as the base of the semiconductor chip 1. Thus, the passivation film 11 is divided into a center portion 111 and a peripheral portion 112 which are disposed on opposite sides of the groove 12. The center portion 111 completely covers the device formation region A (formed with the functional device), and the peripheral portion 112 is spaced a predetermined distance from the periphery of the center portion 111 as surrounding the center portion 111.

The passivation film 11 is composed of silicon oxide or silicon nitride. The passivation film 11 has pad openings 113 through which parts of an internal interconnection of a metal such as aluminum provided in the front surface of the semiconductor chip 1 are exposed as electrode pads 6.

The stress relieving layer 2 is adapted to absorb and relieve a stress applied to the semiconductor device. The stress relieving layer 2 is composed of, for example, polyimide, and has a rectangular shape which is slightly smaller than the center portion 111 of the passivation film 11 as seen from above. Further, the stress relieving layer 2 has throughholes 21 provided at positions opposed to the respective electrode pads 6 as extending therethrough.

The rewirings 3 are composed of a metal material such as copper. The rewirings 3 are respectively connected to the electrode pads 6 through the through-holes 21. The rewirings 3 are provided on a front surface of the stress relieving layer 2 as extending to positions opposed to the respective metal balls 5 with the intervention of the sealing resin layer 4.

The sealing resin layer 4 is composed of, for example, an epoxy resin, and seals the front side of the semiconductor chip 1. The sealing resin layer 4 covers front surfaces of the center portion 111 of the passivation film 11, the stress relieving layer 2 and the rewirings 3, and further extends from the front surfaces to side surfaces of these layers to completely fill the groove 12 of the semiconductor chip 1. The sealing resin layer 4 has a flat front surface, and side surfaces flush with side surfaces of the semiconductor chip 1. Thus, the semiconductor device has a generally rectangular solid shape which has a size equivalent to the size of the semiconductor chip 1 as seen in plan.

Flat cylindrical posts 7 of a metal such as copper are respectively provided between the rewirings 3 and the metal balls 5 as extending through the sealing resin layer 4. The rewirings 3 are respectively connected to the metal balls 5 via the posts 7.

The metal balls 5 serve as external connection terminals for connection (external connection) to a wiring board not shown, and are formed of a metal material such as solder as having a ball-like shape.

With the aforesaid arrangement, the passivation film 11 includes the center portion 111 completely covering the device formation region A and the peripheral portion 112 spaced the predetermined distance from the periphery of the center portion 111 as surrounding the center portion 111. In other words, the looped groove 12 is provided in the outermost front surface of the semiconductor chip 1 as surrounding the device formation region A as seen in plan from above, and the passivation film 11 is divided into the center portion 111 and the peripheral portion 112 which are respectively disposed inward and outward of the groove 12. Therefore, even if separation or cracking of the passivation film 11 occurs on the side surface of the semiconductor device, the separation and the cracking can be confined in the peripheral portion 112 of the passivation film 11. As a result, separation and cracking of the center portion 111 of the passivation film 11 are prevented, so that malfunction of the functional device can be prevented which may otherwise occur due to the separation and the cracking.

Further, the side surfaces of the center portion 111 of the passivation film 11 are covered with a portion of the sealing resin layer 4 disposed in the groove 12 located between the center portion 111 and the peripheral portion 112. Therefore, the side surfaces of the center portion 111 of the passivation film 11 can be protected by the sealing resin layer 4, so that the separation and cracking of the center portion 111 can be more assuredly prevented.

Figure 11A:
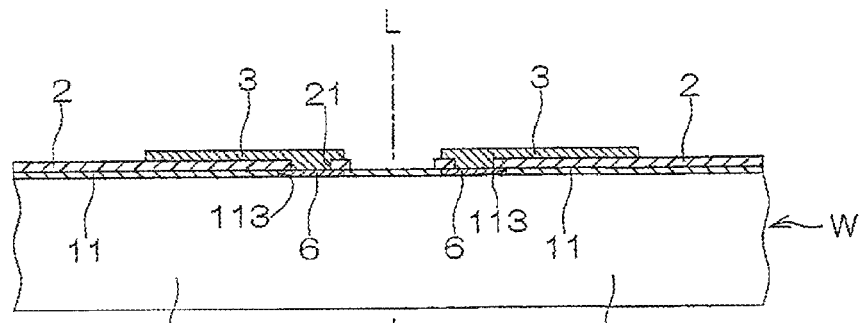
FIGS. 11A-11D are sectional views illustrating the sequential steps of a production process for the semiconductor device shown in FIG. 10.

FIGS. 11A-11D are sectional views illustrating the sequential steps of a production process for the semiconductor device shown in FIG. 10. First, a wafer W formed with a plurality of semiconductor chips 1 and having a passivation film 11 provided in an outermost front surface thereof is prepared. As shown in FIG. 11A, pad openings 113 are formed in the passivation film 11 for exposing electrode pads 6, and then stress relieving layers 2 and rewirings 3 are formed in this order on the passivation film 11.

The stress relieving layers 2 are not present on dicing lines L defined between the semiconductor chips 1. Therefore, the stress relieving layers 2 disposed on adjacent ones of the semiconductor chips 1 on opposite sides of each of the dicing lines L are spaced a predetermined distance from each other, so that the passivation film 11 is partly exposed along the dicing line L between the stress relieving layers 2.

Figure 11B:
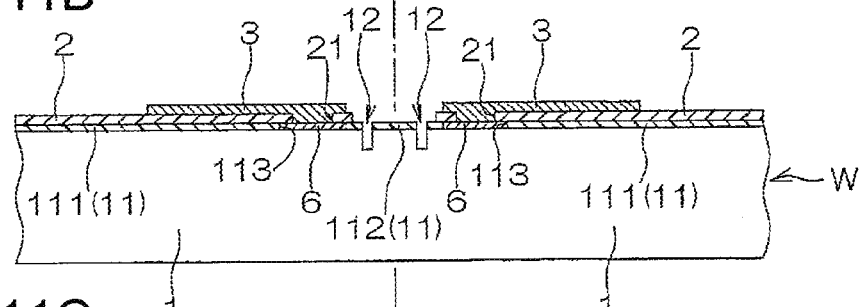

In turn, as shown in FIG. 11B, grooves 12 are formed on the opposite sides of the dicing line L, so that portions of the passivation film 11 are removed from zones each extending alongside the dicing line L and spaced a predetermined distance from the dicing line L. The formation of the grooves 12 is achieved by a half-cutting process for half-cutting the resulting wafer from the front side of the passivation film 11 with the use of a blade (not shown), or by a laser machining process. Where the blade is used, the width and the depth of the grooves 12 are controlled by the thickness of the blade and a cut amount.

Figure 11C:
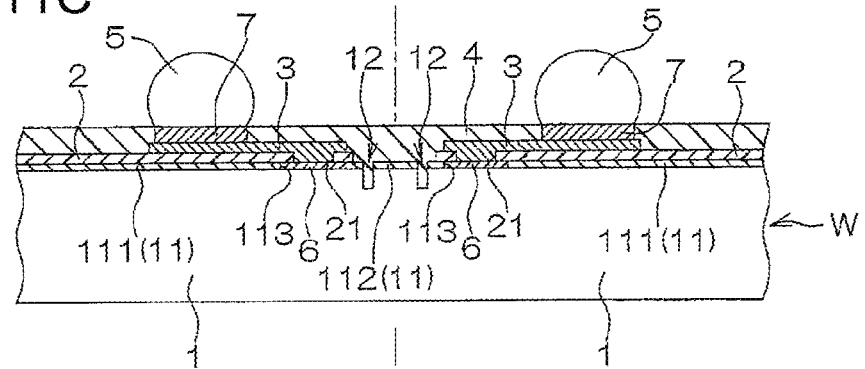

Thereafter, as shown in FIG. 11C, a sealing resin layer 4 is formed over the entire surface of the resulting wafer W. The formation of the sealing resin layer 4 is achieved by applying an uncured epoxy resin over the entire surface of the wafer W and curing the applied epoxy resin. At this time, the uncured epoxy resin partly flows into the grooves 12 and cured in the grooves 12, thereby providing a structure such that the sealing resin layer 4 is partly disposed in the grooves 12 of the semiconductor chips 1. After posts 7 are formed at predetermined positions in the sealing resin layer 4, metal balls 5 are formed on the respective posts 7. The formation of the posts 7 is achieved by forming through-holes in the sealing resin layer 4 and supplying a metal material into the through-holes to fill the through-holes by electroplating.

Figure 11D:
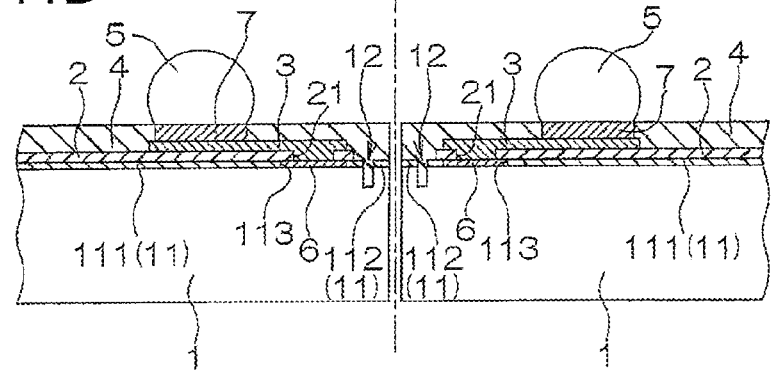

In turn, as shown in FIG. 11D, the resulting wafer W is cut (diced) together with the sealing resin layer 4 along the dicing lines L with the use of a dicing blade (not shown). Thus, the semiconductor device shown in FIG. 10 is provided.

Figure 12:
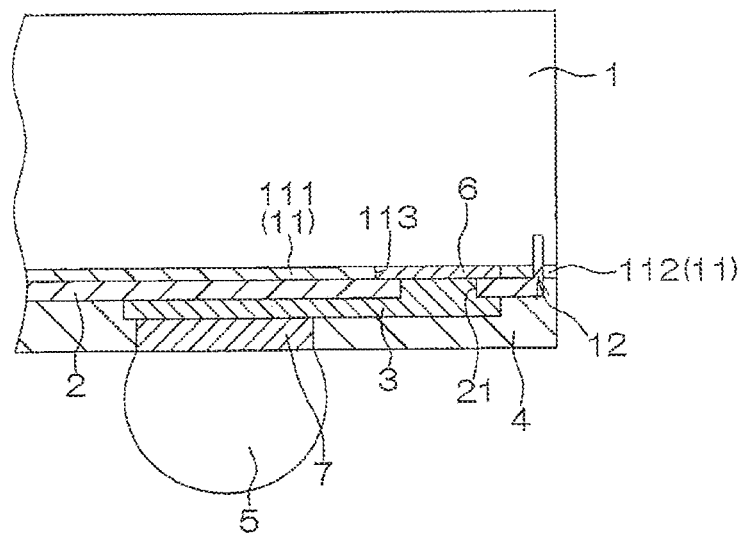
FIG. 12 is a sectional view illustrating the construction of a semiconductor device according to an eighth embodiment of the present invention.

FIG. 12 is a sectional view illustrating the construction of a semiconductor device according to an eighth embodiment of the present invention. In FIG. 12, components corresponding to those shown in FIG. 10 will be denoted by the same reference characters as in FIG. 10.

In the semiconductor device shown in FIG. 12, the stress relieving layer 2 provided on the passivation film 11 is partly disposed in the groove 12 between the center portion 111 and the peripheral portion 112 of the passivation film 11. The sealing resin layer 4 extends to the side surfaces of the stress relieving layer 2 to cover the side surfaces of the stress relieving layer 2.

With this arrangement, the passivation film 11 is divided into the center portion 111 and the peripheral portion 112 which are respectively disposed inward and outward of the groove 12 as in the semiconductor device shown in FIG. 10. Therefore, even if separation or cracking of the passivation film 11 occurs on a side surface of the semiconductor device, the separation and the cracking can be confined in the peripheral portion 112 of the passivation film 11. As a result, separation and cracking of the center portion 111 of the passivation film 11 are prevented, so that malfunction of the functional device can be prevented which may otherwise occur due to the separation and the cracking.

Further, the stress relieving layer 2 is partly disposed in the groove 12 located between the center portion 111 and the peripheral portion 112 of the passivation film 11, and the side surfaces of the center portion 111 of the passivation film 11 are covered with a portion of the stress relieving layer 2 disposed in the groove 12. Therefore, the side surfaces of the center portion 111 of the passivation film 11 can be protected by the stress relieving layer 2. In addition, the portion of the stress relieving layer 2 disposed between the center portion 111 and the peripheral portion 112 of the passivation film 11 also absorbs a stress applied to the semiconductor device. As a result, the separation and cracking of the center portion 111 of the passivation film 11 can be more assuredly prevented.

Further, the sealing resin layer 4 extends to the side surfaces of the stress relieving layer 2 to cover the side surfaces of the stress relieving layer 2. Therefore, the stress relieving layer 2 is shielded from the outside air, so that deterioration of the stress relieving layer 2 can be prevented which may otherwise occur due to moisture contained in the outside air.

Figure 13A:
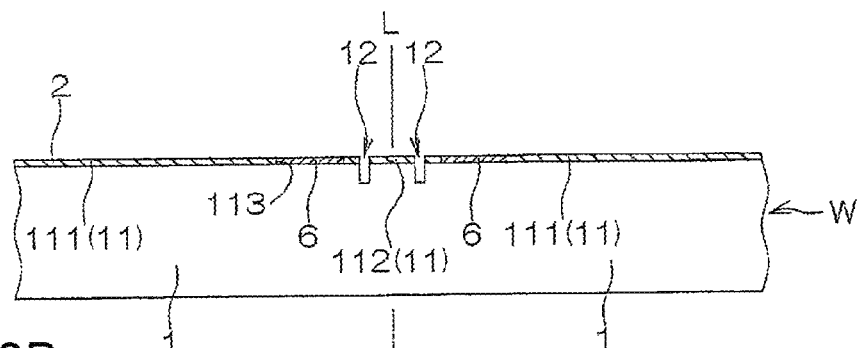
FIGS. 13A-13D are sectional views illustrating the sequential steps of a production process for the semiconductor device shown in FIG. 12.

FIGS. 13A-13D are sectional views illustrating the sequential steps of a production process for the semiconductor device shown in FIG. 12. In the production process for the semiconductor device shown in FIGS. 13A-13D, a wafer W formed with a plurality of semiconductor chips 1 and having a passivation film 11 provided on an outermost front surface thereof is first prepared. As shown in FIG. 13A, pad openings 113 are formed in the passivation film 11 for exposing electrode pads 6, and then grooves 12 are formed on opposite sides of each of dicing lines L, whereby portions of the passivation film 11 are removed from zones each extending alongside the dicing line L and spaced a predetermined distance from the dicing line L.

Figure 13B:
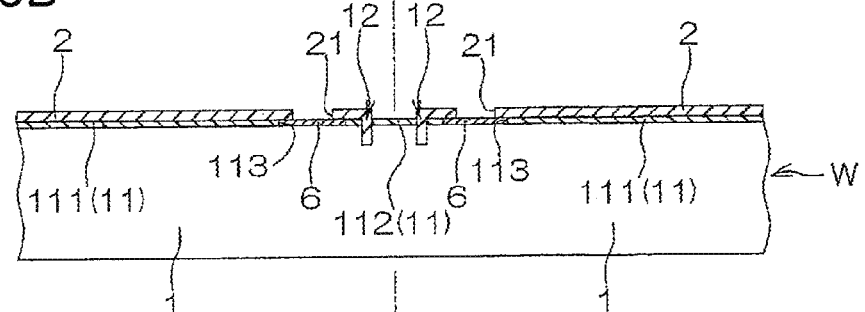

After the formation of the grooves 12, as shown in FIG. 13B, stress relieving layers 2 each having through-holes 21 are formed on the passivation film 11. The formation of the stress relieving layers 2 is achieved by applying liquid (uncured) polyimide over the entire surface of the resulting wafer W except a region having a predetermined width on the dicing line L, and curing the applied polyimide. At this time, the liquid polyimide partly flows into the grooves 12 and cured in the grooves 12, thereby providing a structure such that the stress relieving layers 2 are partly disposed in the grooves 12 of the semiconductor chips 1.

Figure 13C:
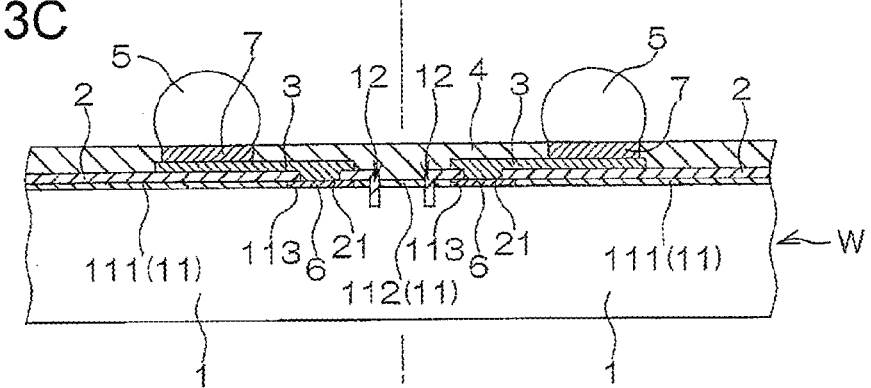

In turn, as shown in FIG. 13C, rewirings 3 and a sealing resin layer 4 are formed on the resulting wafer, and then posts 7 are formed at predetermined positions in the sealing resin layer 4. Further, metal balls 5 are formed on the respective posts 7.

Figure 13D:
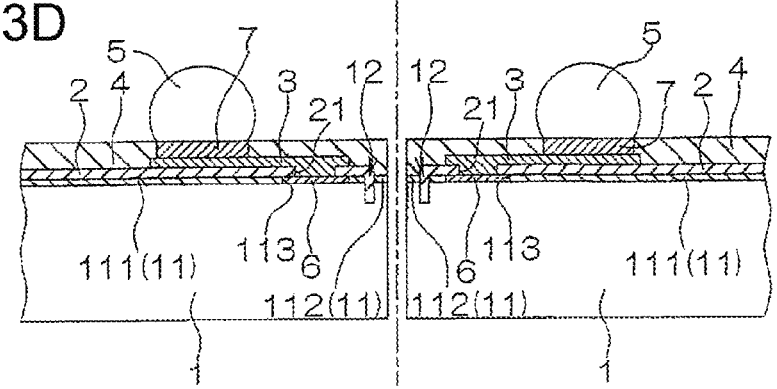

Then, as shown in FIG. 13D, the resulting wafer W is cut (diced) together with the sealing resin layer 4 along the dicing lines L with the use of a dicing blade (not shown). Thus, the semiconductor device shown in FIG. 12 is provided.

Figure 14:
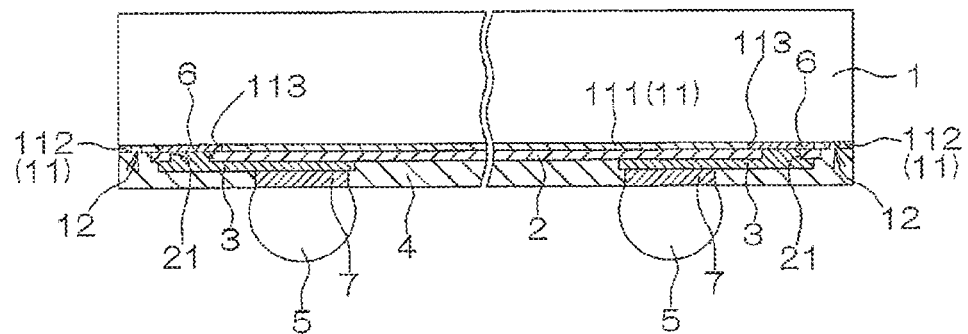
FIG. 14 is a sectional view illustrating a modification of the construction shown in FIG. 10, in which a groove is formed as having a depth equivalent to the thickness of the passivation film.

In the construction shown in FIG. 10, the groove 12 extends into the semiconductor substrate below the passivation film 11, so that the passivation film 11 is not present in the zone extending alongside the dicing line L. However, the groove 12 may have a depth such that at least a portion of the passivation film 11 present in that zone can be removed. As shown in FIG. 14, the groove 12 may have a depth which is equivalent to the thickness of the passivation film 11. The groove 12 having such a depth can be formed by controlling a cut amount in the half-cutting process employing the blade or controlling the intensity and period of irradiation with a laser beam. Alternatively, an etching process (wet etching or dry etching) may be employed for removing only the portion of the passivation film 11 for the assured formation of the groove.

However, where the interlayer film is provided below the passivation film 11 (on the semiconductor substrate), the groove 12 is preferably formed as having a depth such that a portion of the interlayer film present in the zone extending alongside the dicing line L can be removed.

Figure 15:
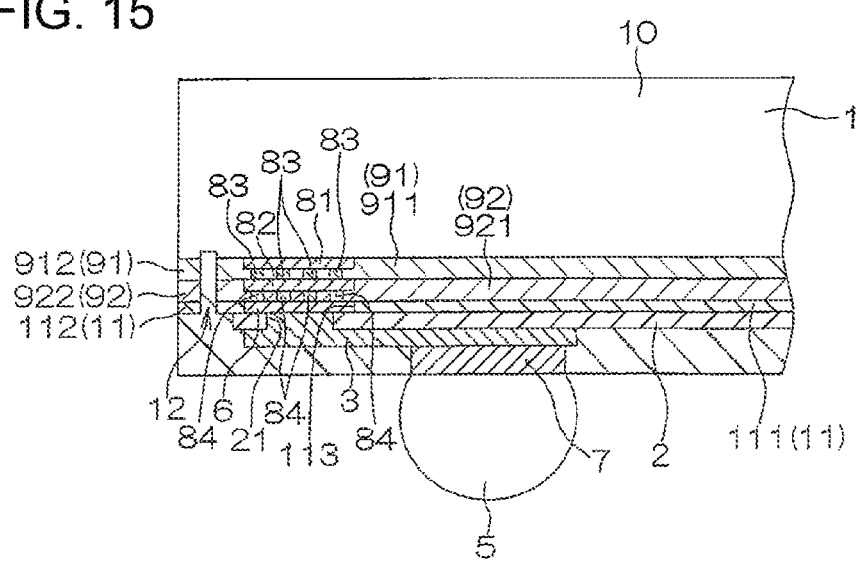
FIG. 15 is a sectional view illustrating an arrangement in which the seventh embodiment is applied to a semiconductor device having a multilevel interconnection structure.

For example, where a semiconductor device having a multi-level structure includes a first interconnection layer 81, a first interlayer film 91, a second interconnection layer 82, a second interlayer film 92 and a passivation film 11 provided in this order on a semiconductor substrate 10 serving as a base of a semiconductor chip 1 with the first interconnection layer 81 being electrically connected to the second interconnection layer 82 through via-holes 83 formed in the first interlayer film 91 and with the second interconnection layer 82 being electrically connected to electrode pads 6 through via-holes 84 formed in the second interlayer film 92 as shown in FIG. 15, the groove 12 is preferably formed as having a depth which is not smaller than a total thickness as measured from the front surface of the passivation film 11 to a rear surface of the first interlayer film. In this case, the groove 12 not only divides the passivation film 11, but also divides the first interlayer film 91 into a center portion 911 and a peripheral portion 912 disposed outward of the center portion 911, and divides the second interlayer film 92 into a center portion 921 and a peripheral portion 922 disposed outward of the center portion 921. Therefore, even if separation or cracking of the passivation film 11, the first interlayer film 91 and/or the second interlayer film 92 occur on a side surface of the semiconductor device, the separation and the cracking can be confined in the peripheral portion 112 of the passivation film 11, the peripheral portion 912 of the first interlayer film 91 and/or the peripheral portion 922 of the second interlayer film 92. As a result, separation and cracking of the center portion 111 of the passivation film 11, the center portion 911 of the first interlayer film 91 and the center portion 921 of the second interlayer film 92 are prevented, so that malfunction of a functional device can be prevented which may otherwise occur due to the separation and the cracking.

Figure 16:
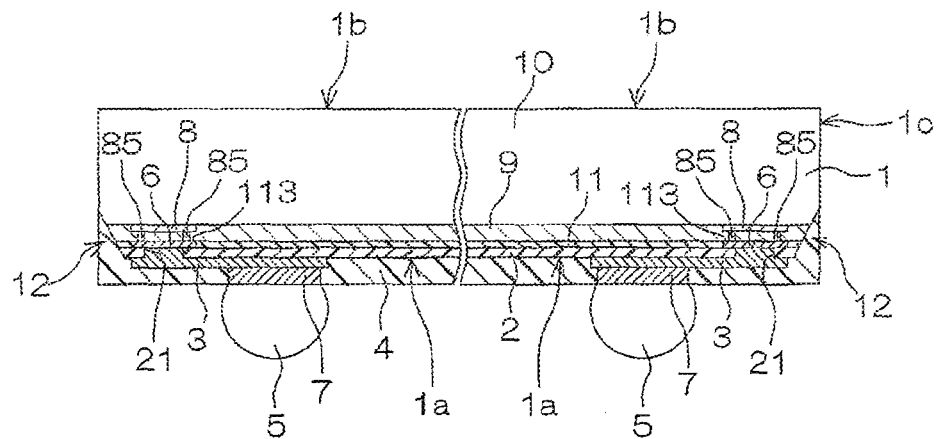
FIG. 16 is a sectional view illustrating the construction of a semiconductor device according to a ninth embodiment of the present invention.

FIG. 16 is a sectional view illustrating the construction of a semiconductor device according to a ninth embodiment of the present invention. In FIG. 16, components corresponding to those shown in FIG. 1 will be denoted by the same reference characters as in FIG. 1.

The semiconductor device is a semiconductor device employing the WL-CSP technique, and includes a semiconductor chip 1 having a passivation film (surface protection film) 11 provided in an outermost front surface thereof, a stress relieving layer 2 provided on the passivation film 11, rewirings 3 provided on the stress relieving layer 2, a sealing resin layer 4 provided over the rewirings 3, and metal balls 5 provided on the sealing resin layer 4.

The semiconductor chip 1 includes an interconnection layer 8 and an interlayer film 9 provided, for example, between a semiconductor substrate 10 of silicon and the passivation film 11. The interconnection layer 8 is provided on the semiconductor substrate 10 as having a pattern, and the interlayer film 9 is provided on the interconnection layer 8 to cover the interconnection layer 8.

The semiconductor chip 1 has a generally rectangular shape as seen in plan, and has a groove 12 provided in a peripheral edge portion of a front surface 1a thereof. The groove 12 has a triangular sectional shape which is tapered toward a rear surface 1b of the semiconductor chip 1. The groove 12 extends to below the interlayer film 9 (into the semiconductor substrate 10). Thus, side surfaces of the passivation film 11 and the interlayer film 9 are exposed in the groove 12.

The passivation film 11 is composed of silicon oxide or silicon nitride, and covers the entire surface of the interlayer film 9 except for the groove 12. The passivation film 11 has pad openings 113 through which parts of an internal interconnection of a metal such as aluminum provided in the front surface of the semiconductor chip 1 are exposed as electrode pads 6. The electrode pads 6 are electrically connected to the interconnection layer 8 through via-holes 85 extending through the interlayer film 9.

The stress relieving layer 2 is composed of, for example, polyimide, and is adapted to absorb and relieve a stress applied to the semiconductor device. The stress relieving layer 2 has through-holes 21 provided at positions opposed to the respective electrode pads 6 as extending therethrough.

The rewirings 3 are composed of a metal material such as copper. The rewirings 3 are respectively connected to the electrode pads 6 through the through-holes 21. The rewirings 3 are provided on a front surface of the stress relieving layer 2 as extending to positions opposed to the respective metal balls 5 with the intervention of the sealing resin layer 4.

The sealing resin layer 4 is composed of, for example, an epoxy resin, and seals the front surface 1a of the semiconductor chip 1. The sealing resin layer 4 covers the front surfaces of the stress relieving layer 2 and the rewirings 3. Further, the sealing resin layer 4 extends from the front surfaces into the groove 12 to completely fill the groove 12 of the semiconductor chip 1. Thus, the side surfaces of the passivation film 11 and the interlayer 9 are covered with a portion of the sealing resin layer 4 disposed in the groove 12. The sealing resin layer 4 has a flat front surface, and side surfaces flush with side surfaces 1c of the semiconductor chip 1. Thus, the semiconductor device has a generally rectangular solid shape which has a size equivalent to the size of the semiconductor chip 1 as seen in plan.

Flat cylindrical posts 7 of a metal such as copper are respectively provided between the rewirings 3 and the metal balls 5 as extending through the sealing resin layer 4. The rewirings 3 are respectively connected to the metal balls 5 via the posts 7.

The metal balls 5 serve as external connection terminals for connection (external connection) to a wiring board not shown, and are formed of a metal material such as solder as having a ball-like shape.

Figure 17:
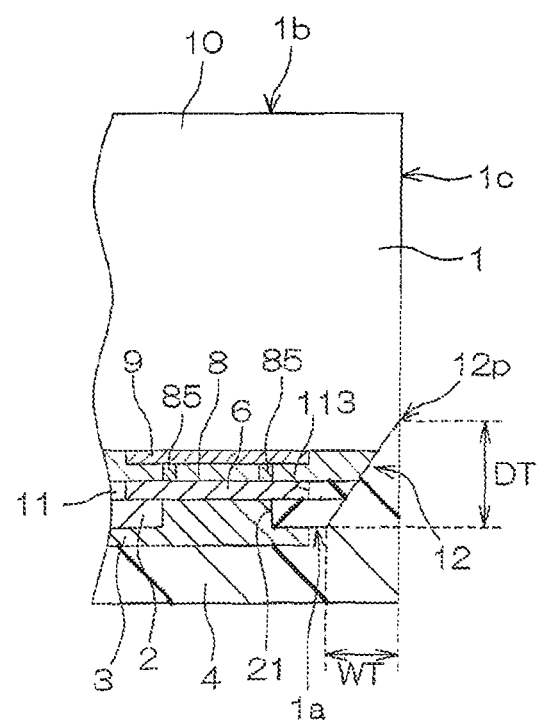
FIG. 17 is an enlarged view for explaining the dimensions of a groove of the semiconductor device shown in FIG. 16.

FIG. 17 is an enlarged view for explaining the dimensions of the groove 12 of the semiconductor device shown in FIG. 16. The groove 12 has a width WT which is greater than 5 μm and smaller than 50 μm as measured within a plane containing the front surface 1a of the semiconductor chip 1. The groove 12 has a depth DT which is greater than 3 μm and smaller 50 μm as measured perpendicularly to the plane containing the front surface 1a of the semiconductor chip 1.

Where the semiconductor chip 1 has a thickness of 490 μm as measured from the front surface 1a to the rear surface 1b thereof, for example, a thickness between the deepest portion 12p of the groove 12 and the rear surface 1b of the semiconductor chip 1 is greater than 440 μm and smaller than 487 μm. Where the semiconductor chip 1 has a thickness of 330 μm as measured from the front surface 1a to the rear surface 1b thereof, a thickness between the deepest portion 12p of the groove 12 and the rear surface 1b of the semiconductor chip 1 is greater than 280 μm and smaller than 327 μm.

According to this embodiment, as described above, the groove 12 is provided in the peripheral edge portion of the front surface 1a of the semiconductor chip 1 throughout the periphery of the semiconductor chip 1, and the sealing resin layer 4 is partly disposed in the groove 12. Thus, side surfaces 1c of a front portion of the semiconductor chip 1 are covered with the portion of the sealing resin layer 4 disposed in the groove 12. This prevents separation and cracking of the passivation film 11 and the underlying interlayer film 9 provided in the front portion of the semiconductor chip 1.

Since the width WT of the groove 12 as measured within the plane containing the front surface 1a of the semiconductor chip 1 is greater than 5 μm, the portion of the sealing resin layer 4 disposed in the groove 12 sufficiently adheres to the semiconductor substrate 10 serving as the base of the semiconductor chip 1. This prevents separation of the sealing resin layer 4 from the semiconductor substrate 10. Since the width WT of the groove 12 as measured within the plane containing the front surface 1a of the semiconductor chip 1 is smaller than 50 μm, the groove 12 does not reach a region of the semiconductor chip 1 formed with a functional device. Hence, there is no possibility that the functional device of the semiconductor chip 1 is damaged.

Further, the depth DT of the groove 12 as measured perpendicularly to the plane containing the front surface 1a of the semiconductor chip 1 is greater than 3 μm, so that at least the passivation film 11 disposed in the outermost front surface of the semiconductor chip 1 can be protected. Since the depth DT of the groove 12 as measured perpendicularly to the plane containing the front surface 1a of the semiconductor chip 1 is smaller than 50 μm, the semiconductor chip 1 (semiconductor substrate 10) has a sufficient strength. In the production process for the semiconductor device, the rear surface 1b of the semiconductor chip 1 (semiconductor substrate 10) is ground by a grinder for thickness reduction of the semiconductor device. If the groove 12 is too deep, a portion of the semiconductor chip 1 between the rear surface 1b and the groove 12 is liable to be cracked when the grinder is pressed against the rear surface 1b of the semiconductor chip 1. With this arrangement, however, the depth of the groove 12 is smaller than 50 μm, so that the semiconductor chip 1 has strength sufficient to prevent such cracking.

FIGS. 18A-18D are sectional views illustrating the sequential steps of a production process for the semiconductor device shown in FIG. 16. In the production process for the semiconductor device shown in FIG. 16, a wafer W having an outermost front surface covered with a passivation film 11 is prepared. The wafer has an interconnection layer 8, an interlayer film 9 and via-holes 85 provided below the passivation film 11.

Figure 18A:
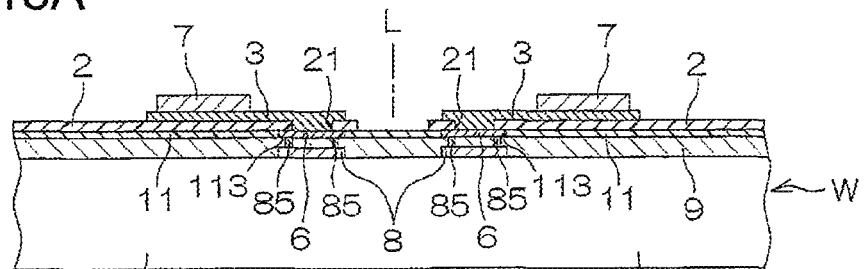
FIGS. 18A-18D are sectional views illustrating the sequential steps of a production process for the semiconductor device shown in FIG. 16.

As shown in FIG. 18A, pad openings 113 are first formed in the passivation film 11 for exposing electrode pads 6. Then, stress relieving layers 2 and rewirings 3 are formed in this order on the passivation film 11. Further, posts 7 are formed at predetermined positions (positions at which metal balls 5 are to be formed) on the rewirings 3, for example, by electroplating.

The stress relieving layers 2 are not present on dicing lines L defined between the semiconductor chips 1. Therefore, the stress relieving layers 2 disposed on adjacent ones of the semiconductor chips 1 on opposite sides of each of the dicing lines L are spaced a predetermined distance from each other, so that the passivation film 11 is partly exposed on the dicing line L between the stress relieving layers 2.

Figure 18B:
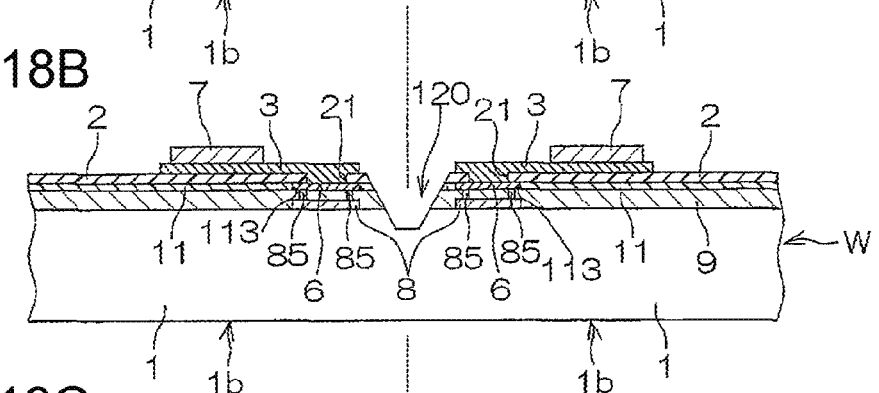

In turn, as shown in FIG. 18B, a recess 120 is formed along the dicing line L as extending from the front surfaces of the stress relieving layers 2 to below the interlayer film 9. The recess 120 has an inverted trapezoidal sectional shape tapered toward the rear surface 1b of the semiconductor chip 1. The formation of the recess 120 is achieved by a half-cutting process employing a blade (not shown) having a peripheral portion in a trapezoidal sectional shape conforming to the sectional shape of the recess 120, or by a laser machining process.

Figure 18C:
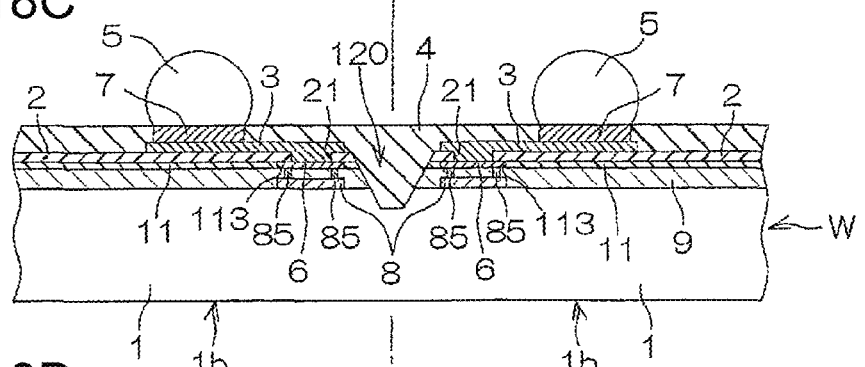

Thereafter, as shown in FIG. 18C, a sealing resin layer 4 is formed over the entire front surface of the wafer W. The formation of the sealing resin layer 4 is achieved by applying an uncured epoxy resin over the entire front surface of the wafer W, curing the applied epoxy resin and grinding the surface of the cured epoxy resin to expose the posts 7.

Figure 18D:
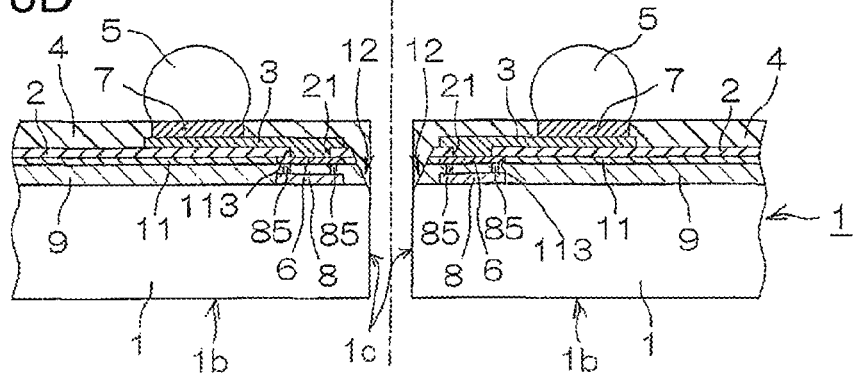
Figure 19:
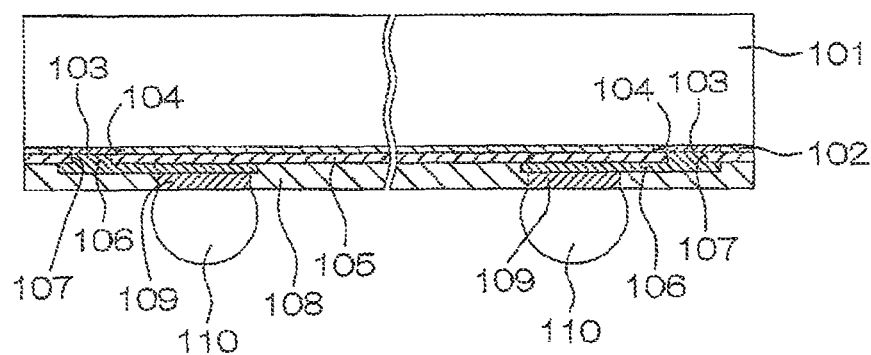
FIG. 19 is a sectional view illustrating the construction of a prior art semiconductor device.

After the metal balls 5 are formed on the respective posts 7, as shown in FIG. 18D, the resulting wafer W is cut (diced) together with the sealing resin layer 4 along the dicing lines L with the use of a dicing blade not shown. Thus, the semiconductor device shown in FIG. 16 is provided.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

By the production method shown in FIG. 2A-2D, for example, a semiconductor device having no groove 12 may be produced. That is, a semiconductor device in which no groove 12 is provided and the passivation film 11 has side surfaces covered with the sealing resin layer 4 is provided by removing only a part of the passivation film 11 by controlling the cut amount in the half-cutting process employing the blade or controlling the intensity and period of the irradiation with the laser beam in the step shown in FIG. 2B.

Further, the present invention is applicable not only to the semiconductor devices employing the WL-CSP technique but also to a semiconductor device adapted to be mounted on a mount board with a front surface of a semiconductor chip thereof being opposed to the mount board and with a rear surface of the semiconductor chip thereof being exposed (for bare chip mounting).

What is claimed is:
1. A semiconductor device comprising:
a semiconductor chip having a passivation film;
a stress relieving layer provided over the passivation film for absorbing and relieving an externally applied stress; and
a sealing resin layer provided on the stress relieving layer for sealing a front side of the semiconductor chip, wherein:
the semiconductor chip has a groove formed therein from a front surface thereof at a peripheral edge portion of the front surface,
in a sectional view of the semiconductor device perpendicular to the groove, a portion of the front surface separates the groove from one side surface of the semiconductor device that is closer to the groove than another side surface of the semiconductor device,
the portion of the front surface has a first portion and a second portion facing the first portion across the groove, and
the sealing resin layer has a side surface which is substantially flush with a side surface of the stress relieving layer.

2. A semiconductor device comprising:
a semiconductor chip having a passivation film;
a stress relieving layer provided over the passivation film for absorbing and relieving an externally applied stress; and
an interlayer film provided between the passivation film and a semiconductor substrate serving as a base of the semiconductor chip, wherein:
the semiconductor chip has a groove formed therein from a front surface thereof at a peripheral edge portion of the front surface,
in a sectional view of the semiconductor device perpendicular to the groove, a portion of the front surface separates the groove from one side surface of the semiconductor device that is closer to the groove than another side surface of the semiconductor device,
the portion of the front surface has a first portion and a second portion facing the first portion across the groove,
the stress relieving layer is partly disposed in the groove, and
the stress relieving layer extends to side surfaces of the passivation film and the interlayer film to cover the side surfaces of the passivation film and the interlayer film.

3. A semiconductor device comprising:
a semiconductor chip having a passivation film;
a sealing resin layer provided over the passivation film for sealing a front surface of the semiconductor chip; and
a stress relieving layer provided between the passivation film and the sealing resin layer for absorbing and relieving an externally applied stress, wherein:
the sealing resin layer extends to a side surface of the passivation film to cover the side surface, the semiconductor chip has a groove formed therein from the front surface thereof at a peripheral edge portion of the front surface, in a sectional view of the semiconductor device perpendicular to the groove, a portion of the front surface separates the groove from one side surface of the semiconductor device that is closer to the groove than another side surface of the semiconductor device, and the stress relieving layer is substantially flush with the side surface of the passivation film.

4. The semiconductor device according to claim 3, wherein the sealing resin layer is partly disposed in the groove.

5. The semiconductor device according to claim 4, wherein the passivation film is divided into a center portion and a peripheral portion disposed on opposite sides of the groove, the center portion completely covering a device formation region of the semiconductor chip, the peripheral portion being spaced a predetermined distance from a periphery of the center portion and surrounding the center portion.

6. The semiconductor device according to claim 4, further comprising a stress relieving layer provided between the passivation film and the sealing resin layer for absorbing and relieving an externally applied stress, wherein:

the stress relieving layer is partly disposed in the groove.

7. The semiconductor device according to claim 6, wherein the sealing resin layer extends to a side surface of the stress relieving layer.

8. The semiconductor device according to claim 4, wherein:

the groove is provided along an outermost peripheral edge of the front surface of the semiconductor chip, and the groove has a width which is greater than 5 µm as measured within a plane containing the front surface of the semiconductor chip, and a depth which is greater than 3 µm and smaller than 50 µm as measured perpendicularly to the plane.

9. The semiconductor device according to claim 8, wherein the groove has a triangular sectional shape which is tapered toward a rear surface of the semiconductor chip.

10. The semiconductor device according to claim 3, wherein the sealing resin layer extends to a side surface of the stress relieving layer.

11. A semiconductor device comprising:

a semiconductor chip having a passivation film;

a sealing resin layer provided over the passivation film for sealing a front surface of the semiconductor chip; and an interlayer film provided between the passivation film and a semiconductor substrate serving as a base of the semiconductor chip, wherein:

the sealing resin layer extends to a side surface of the passivation film to cover the side surface, the semiconductor chip has a groove formed therein from the front surface thereof at a peripheral edge portion of the front surface, in a sectional view of the semiconductor device perpendicular to the groove, a portion of the front surface separates the groove from one side surface of the semiconductor device that is closer to the groove than another side surface of the semiconductor device, the sealing resin layer is partly disposed in the groove, and the sealing resin layer extends to side surfaces of the passivation film and the interlayer film to cover the side surfaces of the passivation film and the interlayer film.

* * * * *